(12) United States Patent
Vannier

(10) Patent No.: US 8,492,264 B2
(45) Date of Patent: Jul. 23, 2013

(54) METHOD FOR FORMING INTERCONNECTION LEVELS OF AN INTEGRATED CIRCUIT

(75) Inventor: Patrick Vannier, Le Versoud (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 143 days.

(21) Appl. No.: 13/195,309

(22) Filed: Aug. 1, 2011

(65) Prior Publication Data

US 2012/0040525 A1  Feb. 16, 2012

Related U.S. Application Data

(63) Continuation of application No. 12/411,944, filed on Mar. 26, 2009, now abandoned.

(30) Foreign Application Priority Data

Mar. 28, 2008 (FR) ..................... 08 52035

(51) Int. Cl.
   *H01L 21/4763* (2006.01)
(52) U.S. Cl.
   USPC .......... 438/618; 438/9; 438/663; 438/692; 257/E21.006; 257/E21.077; 257/E21.223; 257/E21.227; 257/E21.267; 257/E21.278; 257/E21.304; 257/E21.311; 257/E21.585
(58) Field of Classification Search
   USPC .......... 438/618, 692, 9, 509, 637, 687, 663, 438/769, 960; 257/E21.006, E21.007, E21.223, 257/E21.227, E21.267, E21.278, E21.304, 257/E21.311, E21.585
   See application file for complete search history.

(56) References Cited

U.S. PATENT DOCUMENTS

| | | | |
|---|---|---|---|
| 6,500,770 B1 * | 12/2002 | Cheng et al. | 438/782 |
| 6,943,451 B2 | 9/2005 | Whitechair et al. | |
| 7,227,171 B2 | 6/2007 | Bez et al. | |
| 7,459,792 B2 | 12/2008 | Chen | |
| 7,741,714 B2 | 6/2010 | Huang et al. | |
| 2004/0102031 A1 | 5/2004 | Kloster et al. | |
| 2005/0191847 A1 | 9/2005 | Misawa et al. | |
| 2007/0077782 A1 | 4/2007 | Lee et al. | |

OTHER PUBLICATIONS

French Search Report dated Nov. 19, 2008 from French Patent Application No. 08/52035.

* cited by examiner

*Primary Examiner* — David Nhu
(74) *Attorney, Agent, or Firm* — Wolf, Greenfield & Sacks, P.C.

(57) ABSTRACT

A method for forming interconnection levels of an integrated circuit, including the steps of: (a) forming an interconnection level comprising conductive tracks and vias separated by a porous dielectric material; (b) forming, on the interconnection level, a layer of a non-porous insulating material, said layer comprising openings above portions of porous dielectric material; (c) repeating steps (a) and (b) to obtain the adequate number of interconnection levels; and (d) annealing the structure.

26 Claims, 4 Drawing Sheets

METHOD FOR FORMING INTERCONNECTION LEVELS OF AN INTEGRATED CIRCUIT

CROSS REFERENCE TO RELATED APPLICATIONS

This application is a continuation of U.S. application Ser. No. 12/411,944, filed Mar. 26, 2009 entitled METHOD FOR FORMING INTERCONNECTION LEVELS OF AN INTEGRATED CIRCUIT which application claims the priority benefit of French patent application number 08/52035, filed on Mar. 28, 2008, entitled METHOD FOR FORMING INTERCONNECTION LEVELS OF AN INTEGRATED CIRCUIT, which is hereby incorporated by reference to the maximum extent allowable by law.

BACKGROUND OF THE INVENTION

1. Field of the Invention

The present invention relates to an integrated circuit and, more specifically, to a method for forming interconnection levels of an integrated circuit.

2. Discussion of the Related Art

Integrated circuits are comprised of a large number of electronic components which are formed in and on a semiconductor wafer. To properly connect these components, several interconnection levels form the upper portion of the integrated circuits. Each interconnection level comprises conductive tracks. Vias are formed to connect conductive tracks of different interconnection levels.

FIG. 1 is a cross-section view of an example of the stack of several interconnection levels ($N_i$, $N_{i+1}$, $N_{i+2}$ ... ) of an integrated circuit, level $N_1$ being the interconnection level closest to the electronic components.

Each interconnection level $N_i$ comprises a portion $M_i$ in which are formed conductive tracks 10, located above a portion $V_i$ in which are formed vias 12 of contact between tracks of adjacent levels (currently, the vias of interconnection level $N_1$ are of a different nature than the vias of the other levels). In this drawing, the cross-section plane is such that the tracks are cut widthwise, so that conductive tracks 10 appear to be of same cross-section area as vias 12. Vias 12 enable properly connecting two conductive tracks 10 located in two neighboring interconnection levels. As an example, tracks 10 and vias 12 may be made of copper. A dielectric material 14 separates tracks 10 from one another and vias 12 from one another.

Nowadays, electronic components formed in integrated circuits operate at higher and higher frequencies. The frequency increase results in an increase in the values of the stray capacitances which form between the different conductive portions. Further, the continuous miniaturization of electronic components results in a decrease in the size of conductive tracks and a decrease in distances between tracks and between vias, which also increases the values of stray capacitances. Stray capacitances may disturb significantly the operation of a circuit. It is thus desired to decrease as much as possible such stray capacitances and, for this purpose, so-called "low-k" dielectric materials having very low relative permittivities, typically smaller than 3, are used between the different conductive portions.

However, the porosity of dielectric material 14 poses various problems. Especially, the copper of conductive tracks 10 diffuses more easily into porous dielectric materials than into non-porous dielectric materials. To limit such a diffusion, it is particularly useful to form, between two neighboring interconnection levels, a layer 16 which, conventionally, stops the diffusion of conductive material from an interconnection level to the dielectric material of the upper interconnection level and which forms an etch stop layer. Vias 12 cross layer 16. As an example, layer 16 may be made of silicon-carbon nitride (SiCN). It has also been provided to form a barrier layer (not shown) around the conductive tracks and the vias, this layer being made of a conductive material capable of avoiding the diffusion of the conductive material present in an interconnection level towards the porous dielectric material of the same interconnection level. This barrier layer is, for example, formed of tantalum and of tantalum nitride.

Further, on manufacturing of the stack of interconnection levels, various etch and/or polishing and cleaning operations are carried out in liquid or gas phase. Contaminating products may thus penetrate into the pores of the porous dielectric material during these operations. This may cause an alteration of the porous material or an increase in its relative permittivity, which limits the advantage of using such a porous material.

A way to restore the characteristics of the porous material comprises performing, after having formed each interconnection level, an anneal to eliminate the contaminating products present in the porous dielectric material.

FIG. 2 is a cross-section view illustrating a stack of two interconnection levels $N_i$ and $N_{i+1}$. This drawing illustrates the result obtained after having carried out a chem./mech. polishing step (CMP) on the structure and an anneal step aiming at eliminating the contaminating products present in interconnection level $N_{i+1}$. The conductive tracks of the two interconnection levels are shown lengthwise in cross-section view.

Interconnection level $N_i$ comprises conductive tracks 20 surrounded with a porous dielectric material 22. The bottom and the walls of conductive tracks 20 are covered with a thin barrier layer 24 of a material avoiding the diffusion of conductive material from conductive tracks 20 to porous dielectric material 22. A thin layer 26 of a material avoiding the diffusion of conductive material from conductive tracks 20 to interconnection level $N_{i+1}$, for example, made of SiCN, extends above interconnection level $N_i$. Interconnection level $N_{i+1}$, which comprises conductive tracks 28 connected by vias 30 to conductive tracks 20 of interconnection level $N_i$ is formed above thin layer 26. A porous dielectric material 32 separates conductive tracks 28 from one another and vias 30 from one another. The walls and the bottom of conductive tracks 28 and of vias 30 are covered with a thin barrier layer 34 of a conductive material. Interconnection levels $N_i$ and $N_{i+1}$ may be obtained by different known methods.

On forming of interconnection level $N_{i+1}$, the etch and/or polishing and cleaning steps cause the contamination of porous dielectric material 32. An additional step, where an anneal of the structure is performed to enable evaporation of the contaminants, is then carried out. As an example, this anneal step may be carried out at a temperature of approximately 300° C. for approximately 30 minutes. This anneal needs to be performed before deposition of a layer homologous to layer 26 which would create a barrier against the evaporation of contaminants.

In FIG. 2, arrows 36 illustrate the evacuation, during the anneal, of the contaminating products present in porous dielectric material 32. Although the anneal enables eliminating the contaminating products present in porous dielectric material 32, it should be noted that it also causes the expansion of the conductive material of conductive tracks 28. This expansion modifies the upper surface of conductive tracks 28 and makes it rough. Problems, for example, in terms of reliability, may then arise when another interconnection level is desired to be formed on the upper surface of interconnection level $N_{i+1}$. Further, since porous dielectric material 32 is not protected on its upper surface, it is contaminated again by the contact with the air, especially by water vapor, when the structure is taken out of the furnace in which the anneal has been performed. This recontamination is illustrated in FIG. 2 by arrows 38.

To limit the expansion of the conductive material, the anneal temperature may be decreased. However, a decrease in the anneal temperature causes an increase in the duration of this anneal and decreases its efficiency.

SUMMARY OF THE INVENTION

At least one embodiment of the present invention aims at providing a method for forming interconnection levels of an integrated circuit enabling avoiding at least some of the problems of prior art methods.

Thus, an embodiment of the present invention provides a method for forming interconnection levels of an integrated circuit, comprising the steps of:

(a) forming an interconnection level comprising conductive tracks and vias separated by a porous dielectric material;

(b) forming, on the interconnection level, a layer of a non-porous insulating material, said layer comprising openings above portions of porous dielectric material;

(c) repeating steps (a) and (b) to obtain the adequate number of interconnection levels; and (d) annealing the structure.

According to an embodiment of the present invention, an anneal step is performed before each repetition at step (c).

According to an embodiment of the present invention, step (a) of formation of an interconnection level comprises the steps of:

forming a layer of a porous dielectric material;

forming an oxide layer, then a titanium nitride layer on the layer of porous dielectric material;

forming openings in the titanium nitride layer and in an upper portion of the oxide layer at the level of the desired conductive tracks;

forming holes in the oxide layer and in an upper portion of the layer of porous dielectric material at the level of the desired vias;

etching, outside the areas covered with the titanium nitride layer, until the bottom of the holes reaches the conductive tracks of the lower interconnection level;

forming a conductive material in the etched portion; and removing the materials located above the layer of porous dielectric material.

According to an embodiment of the present invention, the step of forming holes and the step of etching outside the areas covered by the titanium nitride layer are etch steps in the presence of argon and of $C_4F_8$.

According to an embodiment of the present invention, the removal of the materials located above the layer of porous dielectric material is performed by chem./mech. polishing (CMP).

According to an embodiment of the present invention, the layers of non porous insulating material are made of silicon-carbon nitride (SiCN) and the conductive tracks and the vias are made of copper.

An embodiment of the present invention provides an integrated circuit comprising a stack of interconnection levels, each interconnection level comprising conductive tracks, conductive tracks of different interconnection levels capable of being connected by vias, the conductive tracks and the vias being separated by porous dielectric materials, non-porous insulating layers crossed by the vias being formed on the different interconnection levels, said non-porous insulating layers comprising openings located on portions of porous dielectric materials.

According to an embodiment of the present invention, the porous dielectric materials have thicknesses ranging between 100 and 250 nm.

According to an embodiment of the present invention, the layers of non-porous insulating material are made of silicon-carbon nitride (SiCN) and the conductive tracks and the vias are made of copper.

According to an embodiment of the present invention, the openings in the non-porous insulating layers have dimensions greater than 70 nm.

The foregoing and other objects, features, and advantages of the present invention will be discussed in detail in the following non-limiting description of specific embodiments in connection with the accompanying drawings.

DETAILED DESCRIPTION

Figure 1:
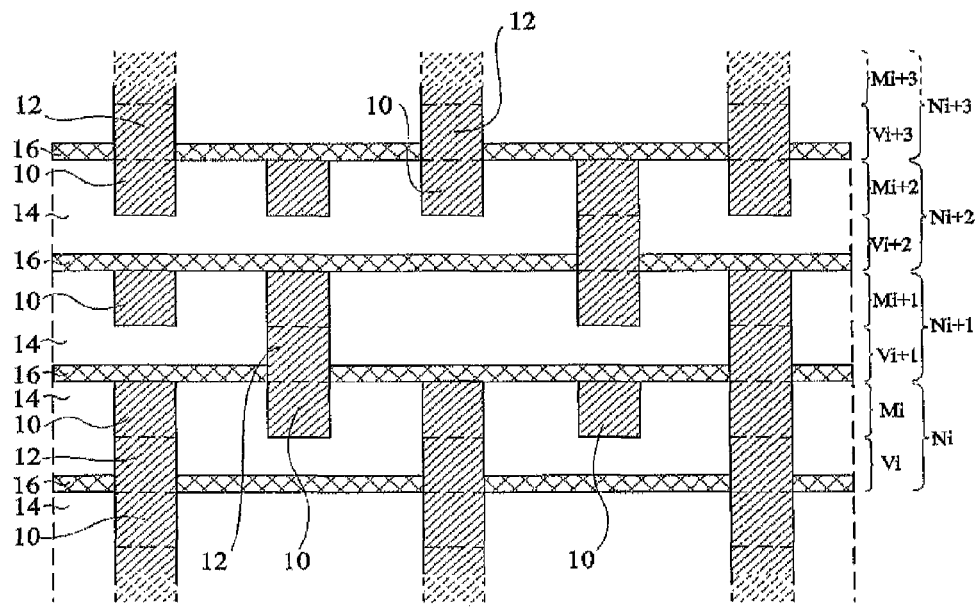
FIG. 1, previously described, is a cross-section view of several interconnection levels of an integrated circuit.
Figure 2:
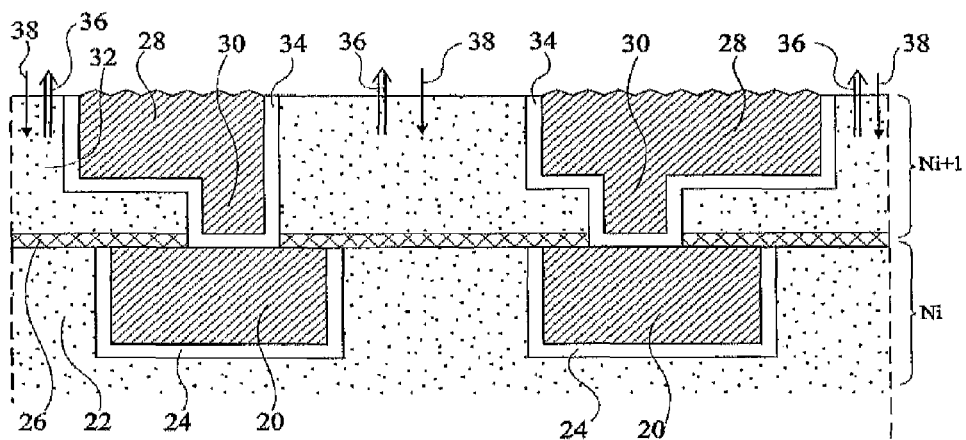
FIG. 2, previously described, illustrates the result obtained after having performed an anneal on an interconnection level $N_{i+1}$.

For clarity, the same elements have been designated with the same reference numerals in the different drawings and, further, as usual in the representation of integrated circuits, the various drawings are not to scale.

FIGS. 3A to 3I are cross-section views illustrating results of steps of a method for manufacturing a stack of interconnection levels according to an embodiment of the present invention. FIGS. 3A to 3G are drawn along a first cross-section plane and FIGS. 3H and 3I along a second cross-section plane.

Figure 3A:
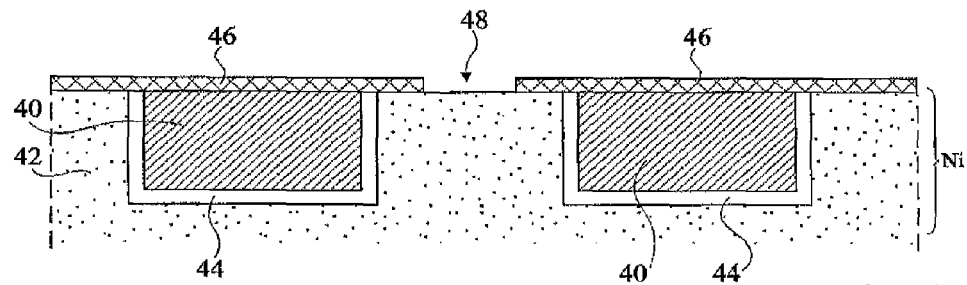
FIGS. 3A to 3I are cross-section views illustrating steps of a method for manufacturing a stacking of interconnection levels according to an embodiment of the present invention.

In FIG. 3A, it is started from a structure in which an interconnection level $N_i$ has already been formed. Interconnection level $N_i$ comprises conductive tracks 40, two of these tracks being shown lengthwise in cross-section view in FIG. 3A. As an example, conductive tracks 40 may be made of copper. Vias (not shown) may also be formed to connect conductive tracks 40 to tracks of lower level. Conductive tracks 40 are separated by a porous dielectric material 42. The walls and the bottom of conductive tracks 40 are covered with a thin barrier layer 44 of a conductive material which prevents the diffusion of copper from conductive tracks 40 to porous dielectric material 42. Above interconnection level $N_i$ is formed a non-porous thin insulating layer 46, for example, made of SiCN, which prevents the diffusion of copper from tracks 40 to interconnection level $N_{i+1}$ which will be formed above insulating layer 46.

According to an aspect of the present invention, non-porous insulating layer 46 comprises openings 48 located above portions of porous dielectric material 42, a single one of openings 48 being shown in FIG. 3A. Openings 48 are formed above portions of interconnection level $N_i$ having a low density of conductive tracks 40.

Figure 3B:
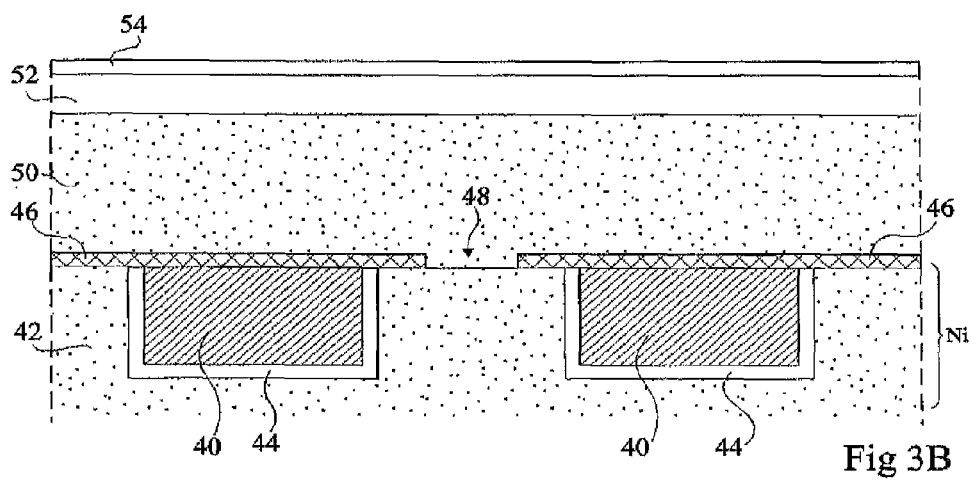

At the step illustrated in FIG. 3B, a thicker layer of porous dielectric material 50 has been formed on thin non-porous insulating layer 46. As an example, layer 50 of porous dielectric material may be obtained by introducing a pore-forming agent into a thick layer of non-porous dielectric material, then reacting the pore-forming agent, for example, by anneal, to eliminate the pore-forming agent and form the pores of the porous dielectric material. On top of layer 50 of porous dielectric material is formed a stack of two layers 52 and 54 which behave as masks in subsequent steps. As an example, layer 52 is a deposited silicon oxide layer and layer 54 is a titanium nitride layer (TiN).

Figure 3C:
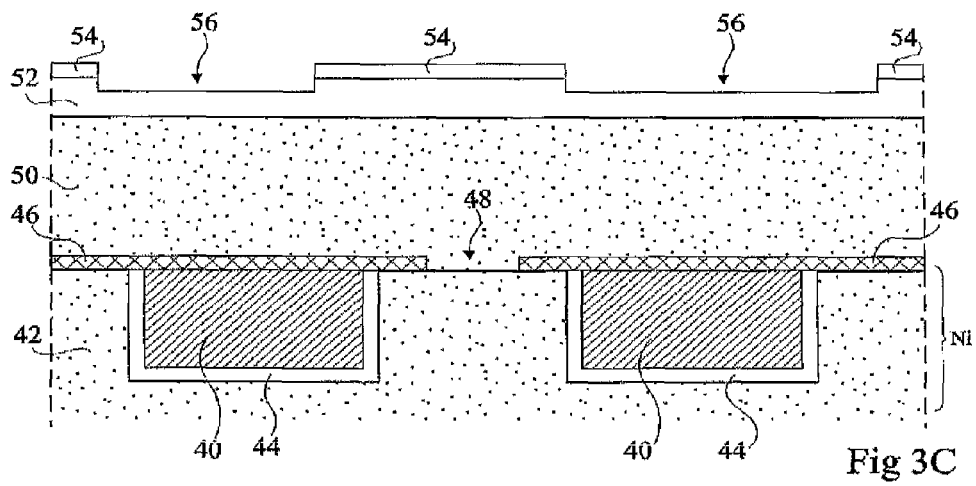

At the step illustrated in FIG. 3C, openings 56 have been formed in titanium nitride layer 54, these openings extending slightly into oxide layer 52. The contour of openings 56 defines the contour of the conductive tracks which will be formed in interconnection level $N_{i+1}$. As an example, openings 56 may be formed by depositing a resist on titanium nitride layer 54, by appropriately insolating and etching this resist, and by etching layers 52 and 54. Layer 52 is only partially etched to avoid any direct contact between the resist and porous dielectric material 50 during the next step.

Figure 3D:
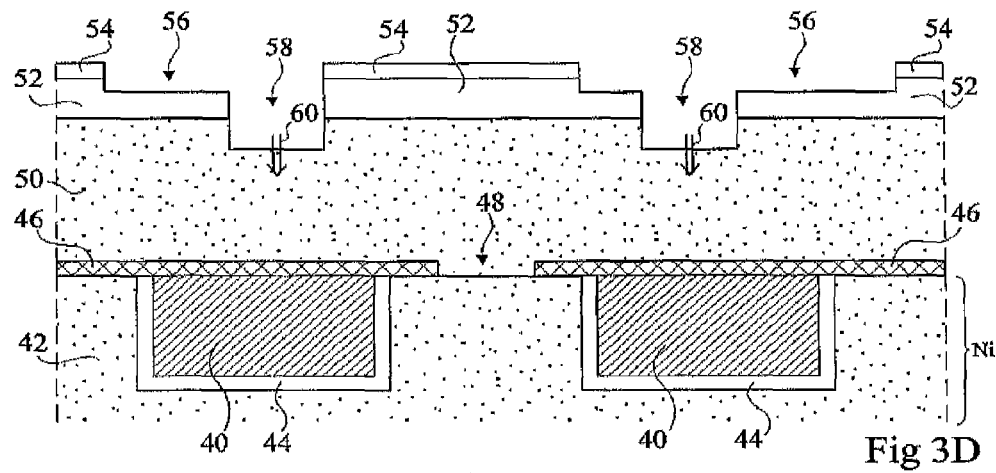

At the step illustrated in FIG. 3D, holes 58 which cross oxide layer 52 and an upper portion of layer 50 of porous dielectric material have been formed in openings 56. Holes 58 define the contour of the vias which will be formed in interconnection layer $N_{i+1}$. Holes 58 may be obtained, by means of an adapted mask, by a physico-chemical etching performed in the presence of argon and of $C_4F_8$. Further, a hydrofluoric acid (HF) cleaning step is carried out after the etching. During the etching and the cleaning, contaminating products (for example, fluorine) penetrate into the pores of porous dielectric material 50, as illustrated in FIG. 3D by arrows 60.

Figure 3E:
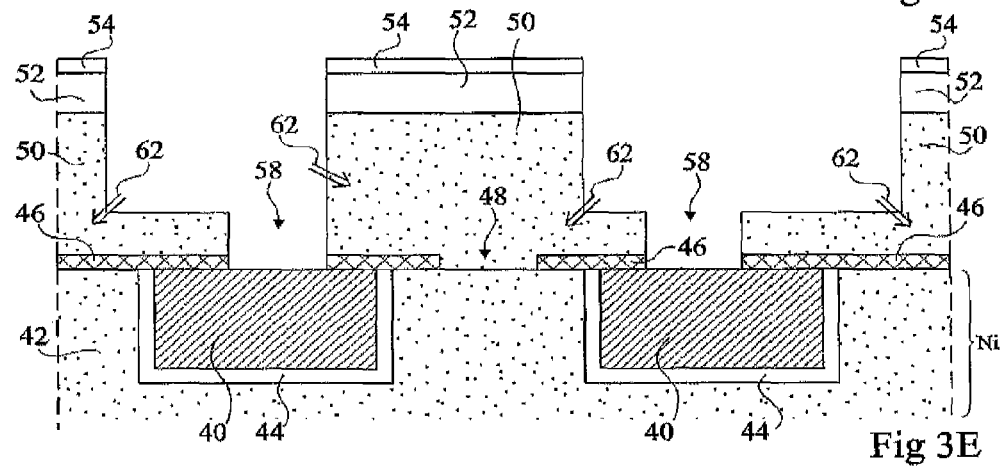

At the step illustrated in FIG. 3E, an etching of the portion of oxide layer 52 and of layer 50 of porous dielectric material which are not protected by titanium nitride layer 54 has been performed. As an example, this etching may again be a physico-chemical etching in the presence of argon and of $C_4F_8$, followed by a cleaning with hydrofluoric acid. This etch step enables forming the contour of the conductive tracks and of the vias of interconnection level $N_{i+1}$. It is performed so that holes 58 cross thin SiCN layer 46 and that they reach conductive tracks 40 of interconnection level $N_i$. In the same way as in the previous etch step, contaminating products penetrate into porous dielectric material 50, during the etching and the cleaning, as indicated by arrows 62 in FIG. 3E.

Figure 3F:
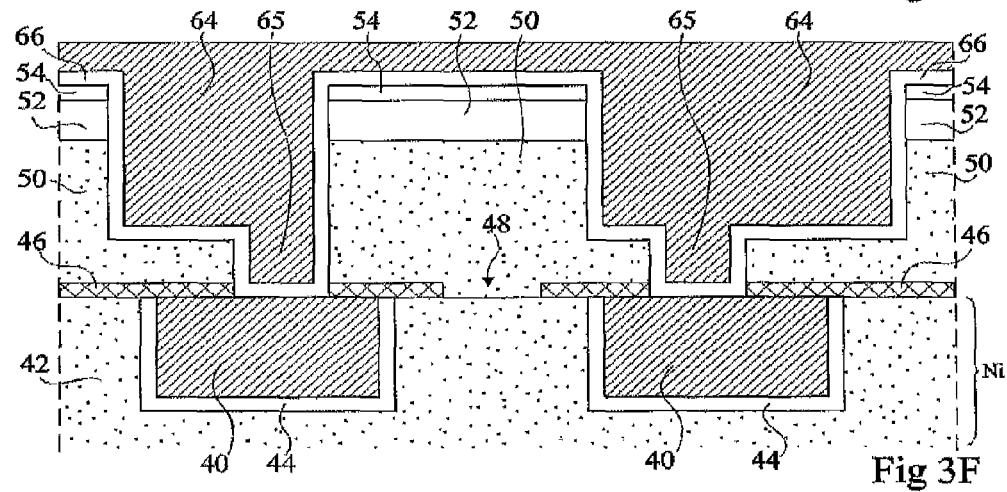

At the step illustrated in FIG. 3F, the space created in the previous etch step has been filled with a conductive material to form conductive tracks 64 and vias 65 of interconnection level $N_{i+1}$. The conductive material of conductive tracks 64 and of vias 65 may be copper, and the metallization is carried out so that the copper fills the spaces contacting conductive track inductive material avoiding the diffusion of copper from conductive layers 64 and vias 65 to the neighboring porous dielectric material 50 may be formed before the metallization.

Figure 3G:
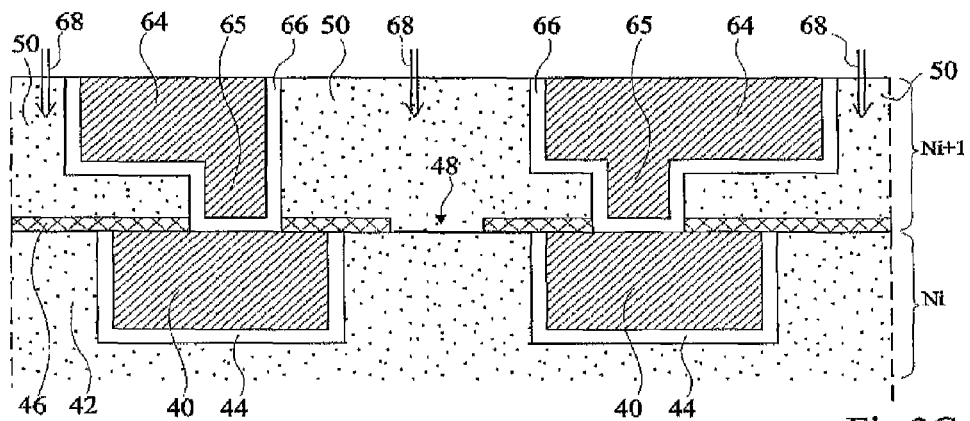

At the step illustrated in FIG. 3G, a chem./mech. polishing (CMP) for removing the excess copper and tantalum nitride 66 located above layer 50 of porous dielectric material, as well as titanium nitride layer 54 and oxide layer 52, has been carried out. In the same way as in the etch steps, during the polishing step and the subsequent cleaning step, contaminating products may penetrate into porous dielectric material 50, as illustrated in FIG. 3G by arrows 68.

Figure 3H:
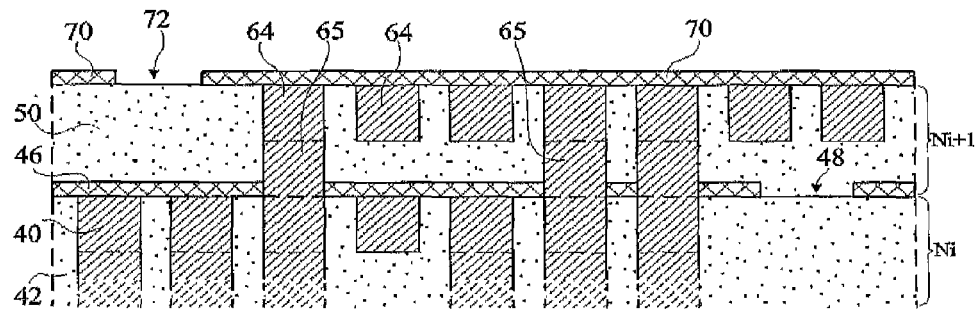
Figure 3I:
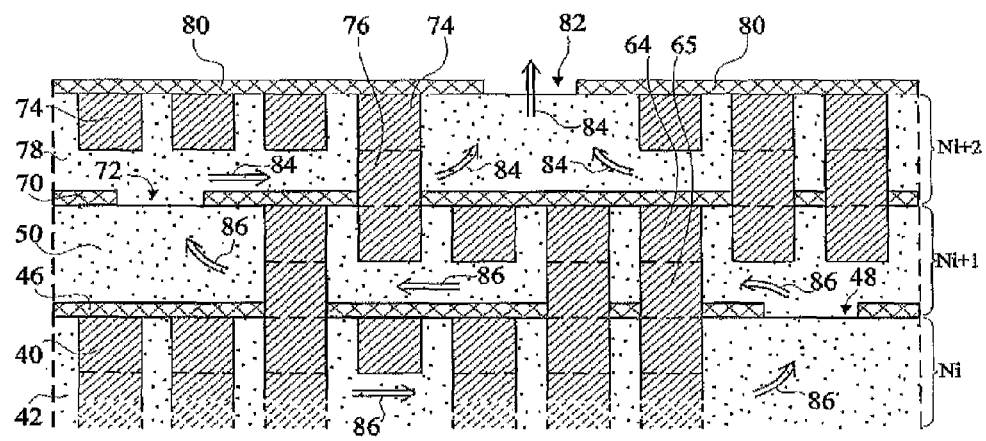

FIGS. 3H to 3I illustrate subsequent steps of the manufacturing method according to an embodiment of the present invention, in a cross-section plane different from that of FIGS. 3A to 3G. In these drawings, all conductive tracks appear lengthwise in cross-section view and the different barrier layers (especially 44 and 66) have not been shown for the simplification.

FIG. 3H illustrates a structure substantially identical to that of FIG. 3G. In this drawing, interconnection levels $N_i$ and $N_{i+1}$ comprise several conductive tracks 40, 64 and several vias 65. Above interconnection level $N_{i+1}$ is formed a non-porous insulating layer 70, for example, made of SiCN.

According to an aspect of the present invention, non-porous insulating layer 70 comprises openings 72 above portions of porous dielectric material 50. In FIG. 3H, a single one of openings 72 is shown. Openings 72 are formed above portions of interconnection level $N_{i+1}$ having a low density of conductive tracks 64.

At the step of FIG. 3I, an interconnection level $N_{i+2}$ has been formed on thin SiCN layer 70. Interconnection level $N_{i+2}$ may be formed in the same way as interconnection level $N_{i+1}$. Interconnection level $N_{i+2}$ comprises conductive tracks 74 and vias 76, the tracks and vias being separated by a porous dielectric material 78.

On top of interconnection level $N_{i+2}$ is formed a thin non-porous insulating layer 80, for example, made of SiCN, which comprises openings 82 above portions of porous dielectric material 78. In FIG. 3I, a single one of openings 82 has been shown. In the same way as for openings 48 and 72, openings 82 are formed above portions of interconnection level $N_{i+2}$ with a low density of conductive tracks.

Preferably, after the forming of each opening 48, 72, and 82 in SiCN layers 46, 70, and 80 on interconnection levels $N_i$, $N_{i+i}$, and $N_{i+2}$, an anneal of the structure enabling evaporation of the contaminating products present in the porous dielectric materials, respectively 42, 50 and 78, of these levels, is performed.

In FIG. 3I, the circulation of contaminating products during an anneal intended to eliminate contaminating products from interconnection level $N_{i+2}$ has been shown. The contaminating products present in layer 78 of porous dielectric material tend to evaporate and to come out through opening 82, as shown by arrows 84. It should be noted that the contaminating products go round vias 76 of interconnection level $N_{i+2}$. Further, this anneal also allows for contaminating products present in the lower levels to migrate upwards in the structure, from level to level, via openings 48, 72 formed in non-porous insulating layers 46, 70, as shown by arrows 86, and to escape from the structure through openings 82 of non-porous insulating layer 80.

Non-porous insulating layers 46, 70, and 80 covering conductive tracks 40, 64, and 74 prevent the expansion of the conductive material of these tracks. This enables annealing at temperatures higher than those currently used and thus enables better evacuation of contaminating products. Further, the recontamination of the porous dielectric material after the anneal steps only occurs in regions with a low density of conductive materials, which does not increase stray capacitances in remote regions with a high density of conductive tracks.

Non-porous insulating layers 46, 70, and 80 may be made of any non-porous insulating material, but they will preferably be made of silicon-carbon nitride SiCN, this material stopping the passing of contaminating products and also avoiding diffusion of the material of conductive tracks 40, 64, and 74 towards the porous dielectric material of the upper levels.

As an example, layers 42, 50, 78 of porous dielectric material have thicknesses ranging between 100 and 250 nm. As an example also, the openings may have dimensions, sides or diameters greater than 70 nm.

Specific embodiments of the present invention have been described. Various alterations, modifications, and improvements will occur to those skilled in the art. In particular, it should be understood that the anneal steps may be carried out after having formed several interconnection levels. Two interconnection levels or more may for example be formed before performing an anneal to evacuate the contaminating products from these two levels. A longer anneal step may also be provided once all interconnection levels have been formed to enable evaporation of the contaminating products remaining in the different interconnection levels.

Openings 48, 72, and 82 may be formed above one another or in shifted fashion, as shown in FIG. 3I.

Further, a specific method for forming an interconnection level comprising tracks and vias has been described, in which the conductive material of the tracks and vias is formed in a single step. It should be understood that the tracks and vias of each interconnection level may be formed separately and by any known method.

As an example, porous dielectric material 42, 50, 78, may be "BDIIx", a material sold by Applied Materials.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method for forming a stack of interconnection levels of an integrated circuit, the method comprising:
   (a) forming an interconnection level comprising conductive tracks formed above conductive vias, the conductive tracks and the conductive vias being laterally separated by a porous dielectric material;
   (b) forming, on the interconnection level, a layer of a non-porous insulating material, said layer of the non-porous insulating material comprising at least one opening exposing at least one portion of the porous dielectric material;
   (c) repeating steps (a) and (b) to obtain an adequate number of interconnection levels of the stack, the conductive vias of a first interconnection level of the stack having another interconnection level below contacting the conductive tracks of the interconnection level below; and
   (d) annealing the stack of interconnection levels of the integrated circuit.

2. The method of claim 1, wherein an anneal step is performed before each repetition at step (c).

3. The method of claim 1, wherein step (a) of formation of an interconnection level comprises the steps of:
   forming a layer of the porous dielectric material;
   forming a silicon oxide layer on the layer of porous dielectric material;
   forming a titanium nitride layer on the silicon oxide layer;
   forming one or more track openings in the titanium nitride layer and in an upper portion of the oxide layer at the level of the conductive tracks;
   forming, within the one or more track openings, holes in the oxide layer and in an upper portion of the layer of porous dielectric material at the level of the conductive vias;
   forming an etched portion by etching areas not covered with the titanium nitride layer until the holes reach the conductive tracks of the interconnection level below;
   forming a conductive material in the etched portion; and
   removing all materials located above the layer of porous dielectric material.

4. The method of claim 3, wherein forming holes and forming an etched portion are etch steps in the presence of argon and of $C_4F_8$.

5. The method of claim 3, wherein the removal of all the materials located above the layer of porous dielectric material is performed by chem./mech. polishing.

6. The method of claim 1, wherein the layers of non-porous insulating material are made of silicon-carbon nitride and the conductive tracks and the conductive vias are made of copper.

7. A method of forming interconnection levels, the method comprising:
   forming a first interconnection level comprising a first porous dielectric material;
   forming, on the first interconnection level, a layer of non-porous insulating material comprising an opening; and
   forming a second interconnection level comprising a second porous dielectric material;
   wherein the opening is positioned such that the first porous dielectric material of the first interconnection level is in contact with the second porous dielectric material of the second interconnection level.

8. The method of claim 7, wherein the porous dielectric material is obtained by introducing a pore-forming agent into a non-porous dielectric material.

9. The method of claim 7, wherein the insulating material is a non-porous insulating material.

10. The method of claim 1, wherein the interconnection level is formed such that a thickness of the interconnection level is between 100 nm and 250 nm.

11. A method of forming interconnection levels, the method comprising:
    forming a first interconnection level comprising a first dielectric material;
    forming, on the first interconnection level, a layer of insulating material comprising an opening; and
    forming a second interconnection level comprising a second dielectric material;
    wherein the opening is positioned such that the first dielectric material of the first interconnection level is in contact with the second porous dielectric material of the second interconnection level.

12. The method of claim 11, wherein the first dielectric material and the second dielectric material are the same material.

13. The method of claim 11, wherein the first dielectric material is a first porous dielectric material, the second dielectric material is a second porous dielectric material, and the insulating material is a non-porous insulating material.

14. The method of claim 11, further comprising:
    annealing the first interconnection level and the layer of insulating material before forming the second interconnection level.

15. The method of claim 11, wherein the first interconnection level further comprises conductive tracks and conductive vias.

16. The method of claim 15, wherein forming the first interconnection level comprises:
    forming a layer of the first dielectric material;
    forming space in the layer of the first dielectric material by etching portions of the first dielectric material; and
    forming conductive tracks and conductive vias within the space formed in the layer of the first dielectric material.

17. The method of claim 16, wherein forming the layer of the first dielectric material comprises:
    forming a non-porous layer of the first dielectric material; and introducing a pore-forming agent into the non-porous layer of the first dielectric material.

18. The method of claim 15, wherein the conductive tracks are made of copper.

19. The method of claim 18, wherein the conductive vias are made of copper.

20. The method of claim 11, wherein a width of the opening is greater than 70 nm.

21. A method for forming a stack of interconnection levels of an integrated circuit, comprising acts of:
 (a) forming an interconnection level comprising conductive tracks formed above conductive vias, the tracks and the vias being laterally separated by a dielectric material;
 (b) forming, on the interconnection level, a layer of an insulating material, said layer comprising openings formed only above portions of the dielectric material; and
 (c) annealing the stack of interconnection levels of the integrated circuit.

22. The method of claim 21, the method further comprising (d) repeating steps (a) and (b) to obtain a desired number of interconnection levels of the stack, the conductive vias of an interconnection level of the stack having another interconnection level below contacting the conductive tracks of the interconnection level below;
 wherein an anneal step is performed before each repetition at step (d).

23. The method of claim 21, wherein step (a) of forming the interconnection level comprises acts of:
 forming a layer of a porous dielectric material, wherein the porous dielectric material is the dielectric material of the interconnection level;
 forming a silicon oxide layer on the layer of porous dielectric material;
 forming a titanium nitride layer on the silicon oxide layer;
 forming openings in the titanium nitride layer and in an upper portion of the oxide layer for a desired location of the conductive tracks;
 forming, at the bottom of the openings, holes in the oxide layer and in an upper portion of the layer of porous dielectric material for a desired location the conductive vias;
 etching, areas not covered with the titanium nitride layer, until the bottom of the holes reaches the conductive tracks of the lower interconnection level;
 forming a conductive material in the etched portion; and
 removing materials located above the layer of porous dielectric material.

24. The method of claim 23, wherein the act of forming holes and the act of etching areas not covered by the titanium nitride layer are achieved by etching in the presence of argon and of $C_4F_8$.

25. The method of claim 23, wherein the act of removing the materials located above the layer of porous dielectric material is achieved by chem./mech. polishing.

26. The method of claim 21, wherein the layer of insulating material is made of silicon-carbon nitride and the conductive tracks and the conductive vias are made of copper.

* * * * *